(12) United States Patent
Qi

(10) Patent No.: US 12,038,637 B2
(45) Date of Patent: Jul. 16, 2024

(54) DISPLAY DEVICE

(71) Applicant: HUIZHOU CHINA STAR OPTOELECTRONICS DISPLAY CO., LTD., Guangdong (CN)

(72) Inventor: Yuanyuan Qi, Guangdong (CN)

(73) Assignee: HUIZHOU CHINA STAR OPTOELECTRONICS DISPLAY CO., LTD., Guangdong (CN)

( * ) Notice: Subject to any disclaimer, the term of this patent is extended or adjusted under 35 U.S.C. 154(b) by 259 days.

(21) Appl. No.: 17/600,273

(22) PCT Filed: Aug. 19, 2021

(86) PCT No.: PCT/CN2021/113536
§ 371 (c)(1),
(2) Date: Sep. 30, 2021

(87) PCT Pub. No.: WO2022/183693
PCT Pub. Date: Sep. 9, 2022

(65) Prior Publication Data
US 2022/0357613 A1 Nov. 10, 2022

(30) Foreign Application Priority Data
Mar. 1, 2021 (CN) .......................... 202110227510.2

(51) Int. Cl.
*G02F 1/1333* (2006.01)
*H05K 1/18* (2006.01)

(52) U.S. Cl.
CPC ....... *G02F 1/133314* (2021.01); *H05K 1/189* (2013.01); *H05K 2201/10136* (2013.01)

(58) Field of Classification Search
CPC ......... H05K 1/189; H05K 2201/10136; H05K 2201/10128; G02F 1/133308; G02F 1/133314; G02F 2202/28; G02F 1/13452
See application file for complete search history.

(56) References Cited

U.S. PATENT DOCUMENTS

2011/0187634 A1* 8/2011 Kim ...................... G09G 3/36
345/102
2012/0327328 A1* 12/2012 Kim .................. G02F 1/133308
349/59
(Continued)

FOREIGN PATENT DOCUMENTS

CN 1952745 A 4/2007
CN 102141696 A 8/2011
(Continued)

*Primary Examiner* — Hoan C Nguyen
(74) *Attorney, Agent, or Firm* — Rivka Friedman

(57) ABSTRACT

The present disclosure discloses a display device, including a display panel, a back panel, and a shading adhesive tape. A bonding region is provided on at least one side of the display panel. The back panel includes bottom panel and a lateral panel surrounding the bottom panel. The lateral panel and the bottom panel form a cavity. The display panel is located in the cavity. A part of the lateral panel away from the bottom panel is disposed adjacent to a perimeter of the display panel. The shading adhesive tape is adjacent to a side of the lateral panel close to the cavity. At least a part of the shading adhesive tape is adhered to a side of the display panel away from the bottom panel and is disposed corresponding to the bonding region.

20 Claims, 4 Drawing Sheets

(56) References Cited

U.S. PATENT DOCUMENTS

| | | | | |
|---|---|---|---|---|
| 2013/0215358 | A1* | 8/2013 | Yu | G02F 1/133308 |
| | | | | 349/58 |
| 2015/0212257 | A1* | 7/2015 | Hsiao | G02B 6/0085 |
| | | | | 362/611 |
| 2015/0277185 | A1* | 10/2015 | Nam | G02B 6/005 |
| | | | | 349/110 |
| 2018/0120644 | A1* | 5/2018 | Aeo | G02F 1/1336 |
| 2019/0008055 | A1* | 1/2019 | Chen | G02F 1/133308 |

FOREIGN PATENT DOCUMENTS

| | | | | |
|---|---|---|---|---|
| CN | 104950500 | A * | 9/2015 | G02F 1/133308 |
| CN | 205581451 | U | 9/2016 | |
| CN | 106292033 | A | 1/2017 | |
| CN | 106814500 | A | 6/2017 | |
| CN | 107219656 | A | 9/2017 | |
| CN | 108614379 | A | 10/2018 | |
| CN | 109709702 | A | 5/2019 | |
| CN | 209624942 | U | 11/2019 | |
| CN | 112086019 | A | 12/2020 | |
| CN | 112859413 | A | 5/2021 | |
| CN | 112965291 | A | 6/2021 | |
| CN | 113031328 | A | 6/2021 | |
| KR | 20050056702 | A * | 5/2005 | |
| KR | 101754288 | B1 | 7/2017 | |
| WO | 2019142620 | A1 | 7/2019 | |

\* cited by examiner

DISPLAY DEVICE

FIELD OF INVENTION

The present disclosure relates to display technologies, and more particularly, to a display device.

BACKGROUND OF INVENTION

With the ongoing development of the production technologies of liquid crystal display devices, liquid crystal display devices gradually develop toward narrow bezels and further develop toward no bezels. A manner of fixing a liquid crystal display panel of a bezel-less liquid crystal display device becomes one of the major subjects at present.

A so-called commercially available bezel-less liquid crystal display device (for example, a liquid crystal television) nowadays is in fact only bezel-less on three sides. Drive cables (for example, chip on film (COF) integrated circuits (IC)) are bonded on at least one side of a panel. Therefore, during the design of a liquid crystal display device, how to cover and protect these drive cables requires to be considered. As a result, the liquid crystal display device can only implement a three-side bezel-less design.

There are two conventional three-side bezel-less technical solutions. In the first solution, a plastic frame is designed as a design surface. An optical assembly is placed in an accommodating cavity formed by a back panel. A liquid crystal display panel is fixed on the plastic frame using a double-sided adhesive tape, to avoid using a front frame. It is designed that the left side, right side, and upper side of a liquid crystal display device are bezel-less, and a decorative strip is disposed on the lower side to cover and protect drive cables bonded to the panel. In the second solution, a back panel is used as a design surface. Plastic frames on the left side, right side, and upper side are adhered on inner sides of the back panel using a double-sided adhesive tape, to form an accommodating cavity for placing an optical assembly. A liquid crystal panel is then fixed on the plastic frames using a double-sided adhesive tape, to avoid using a front frame. It is designed that the left side, right side, and upper side of a liquid crystal display device are bezel-less, and a decorative strip is disposed on the lower side to cover and protect drive cables bonded to the panel.

As can be seen, in the current bezel-less technical solutions, it is designed to use a decorative strip on a side provided with drive cables of a panel to cover and protect the drive cables. As a result, a liquid crystal display device can only implement a three-side bezel-less design. How to implement a four-side bezel-less design for a liquid crystal display device is a major research direction nowadays.

SUMMARY OF INVENTION

The present disclosure provides a display device in which a conventional decorative strip is omitted, thereby greatly reducing costs, and implementing a real four-side bezel-less design.

The present disclosure provides a display device, including:
a display panel, a bonding region being provided on at least one side of the display panel;
a back panel, including a bottom board and a lateral board disposed surrounding the bottom board, wherein the lateral board and the bottom board form a cavity, the display panel is located in the cavity, and a part of the lateral board away from the bottom board is disposed adjacent to a perimeter of the display panel; and
a shading adhesive tape, adjacent to a side of the lateral board close to the cavity, wherein at least a part of the shading adhesive tape is adhered to a side of the display panel away from the bottom board and is disposed corresponding to the bonding region.

Optionally, the lateral board includes a detachable board disposed corresponding to a side provided with the bonding region of the display panel; the detachable board and the display panel are disposed in parallel in a thickness direction of the display panel, and a side of the detachable board close to the cavity is adjacent to the shading adhesive tape; and the detachable board is detachably connected to the bottom board.

Optionally, the display device further includes a flexible circuit board; a part of the flexible circuit board is located in the bonding region, and is bonded to the side of the display panel away from the bottom board; and
the shading adhesive tape at least covers the flexible circuit board located in the bonding region.

Optionally, an end of the flexible circuit board away from the display panel extends through the cavity to a side of the bottom board away from the display panel;
an end of the shading adhesive tape away from the display panel further extends into the cavity; and the shading adhesive tape located in the cavity covers the flexible circuit board located in the cavity, and is laminated to the detachable board.

Optionally, the display device further includes a plastic frame that is disposed in the cavity and is disposed corresponding to the lateral board, and the plastic frame is fixedly connected to the bottom board; a back portion of the display panel is fixedly connected to a side of the plastic frame away from the bottom board; and
the shading adhesive tape located in the cavity is adhered to a side of the plastic frame close to the detachable board; and the flexible circuit board located in the cavity is located between the plastic frame and the shading adhesive tape.

Optionally, the plastic frame includes a detachable sub-plastic frame disposed corresponding to the detachable board; the detachable sub-plastic frame is detachably connected to the bottom board;
the shading adhesive tape located in the cavity is adhered to a side of the detachable sub-plastic frame close to the detachable board; and the flexible circuit board located in the cavity is located between the detachable sub-plastic frame and the shading adhesive tape.

Optionally, the detachable sub-plastic frame includes a support portion detachably connected to the bottom board and an extending portion extending horizontally from an end of the support portion close to the display panel in a direction away from the detachable board; the extending portion is fixedly connected to the back portion of the display panel; and
at least one limiting structure is provided on the extending portion, and the at least one limiting structure is laminated to a side of the display panel close to the detachable board.

Optionally, the detachable sub-plastic frame is fixedly connected to the bottom board by a snap structure.

Optionally, at least one connecting portion that is disposed in parallel to the detachable board and extends in a direction away from the display panel is provided on a side of the bottom board close to the detachable board; a first hole portion is provided in the connecting portion;

a second hole portion provided in alignment with the first hole portion is provided in the detachable board; and the display device further includes a fixed connecting member, and the fixed connecting member penetrates the first hole portion and the second hole portion to fixedly connect the detachable board to the connecting portion.

Optionally, a side of the lateral board away from the bottom board is disposed bending in a direction toward the display panel.

In the display device provided in the present disclosure, a cover adhesive tape and a part of a lateral board of a back panel are used to replace a conventional decorative strip. In an aspect, the cover adhesive tape is black and covers a bonding region of a display panel, and may cover and protect a flexible circuit board located in the bonding region. In addition, the bonding region of the display panel usually has a relatively small width, and a black shading layer is provided in a peripheral non-display region of the display panel. The width of the cover adhesive tape is same as that of the bonding region, and the color of the cover adhesive tape is same as that of the shading layer. Therefore, the arrangement of the cover adhesive tape is not easily visually perceivable. In another aspect, the costs of the cover adhesive tape are much less than those of a decorative strip, to facilitate reduction of costs. In still another aspect, when the lateral board of the back panel is used as a housing, the side of the display panel and the flexible circuit board located in the cavity can be covered and protected, and the thickness of the lateral board is relatively small, to better narrow the bezel. Therefore, in the present disclosure, a decorative strip that is disposed on a display surface of a display panel, configured to cover a bonding region, and has relatively high costs can be omitted, so that production costs can be greatly reduced, and a real four-side bezel-less design can be implemented for a display device.

BRIEF DESCRIPTION OF DRAWINGS

The following describes specific implementations of the present disclosure in detail with reference to the accompanying drawings, to make the technical solutions and other beneficial effects of the present disclosure obvious.

DETAILED DESCRIPTION OF PREFERRED EMBODIMENTS

Figure 1:
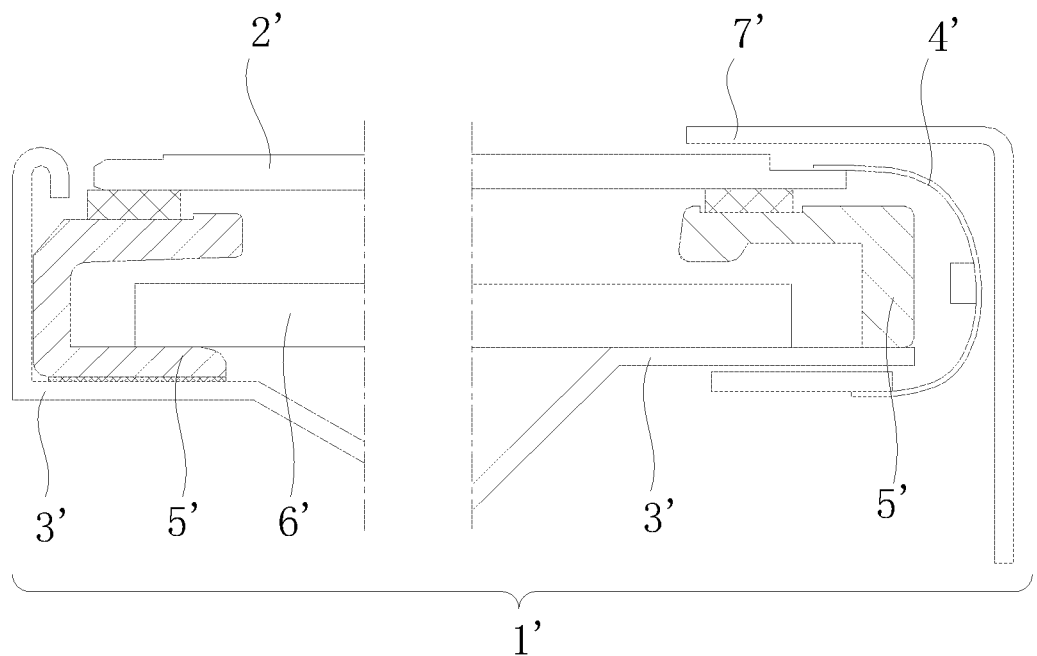
FIG. 1 is an exemplary schematic structural sectional view of a display device.
Figure 2:
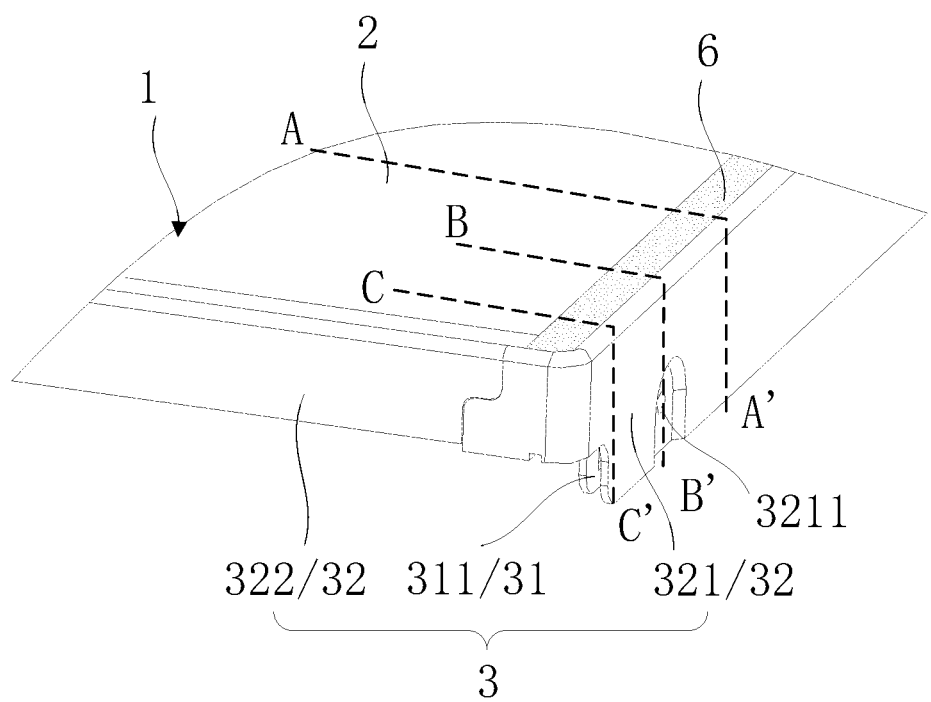
FIG. 2 is a partial schematic structural diagram of a display device according to an embodiment of the present disclosure.

The following clearly and completely describes technical solutions in embodiments of the present disclosure with reference to the accompanying drawings in the embodiments of the present disclosure. Apparently, the described embodiments are only some embodiments rather than all the embodiments of the present disclosure. All other embodiments obtained by a person skilled in the art based on the embodiments of the present disclosure without creative efforts shall fall within the protection scope of the present disclosure.

In the description of the present disclosure, it should be understood that orientation or position relationships indicated by the terms such as "center", "longitudinal", "transverse", "length", "width", "thickness", "on", "below", "front", "back", "left", "right", "vertical", "horizontal", "top", "bottom", "inside", "outside", "clockwise", and "anti-clockwise" are based on orientation or position relationships shown in the accompanying drawings, and are used only for ease and brevity of illustration and description, rather than indicating or implying that the mentioned apparatus or component need have a particular orientation or need be constructed and operated in a particular orientation. Therefore, such terms should not be construed as limiting of the present disclosure. In addition, the terms "first" and "second" are used for descriptive purposes only and are not to be construed as indicating or implying relative importance or implicitly indicating the number of technical features indicated. Thus, features defined by "first" and "second" may explicitly or implicitly include one or more of the features. In the descriptions of the present disclosure, "a plurality of" means two or more, unless otherwise definitely and specifically limited.

In the description of the present disclosure, it should be noted that, unless otherwise explicitly stipulated and restricted, terms "installation", "joint connection", and "connection" should be understood broadly, which, for example, may be a fixed connection, or may be a detachable connection, or an integral connection; or may be a mechanical connection, or may be an electrical connection, or may be mutual communication; or may be a direct connection, or may be an indirect connection by using a medium, or may be an internal communication between two components, or may be an interactive relationship between two components. A person of ordinary skill in the art may understand the specific meanings of the foregoing terms in the present disclosure according to specific situations.

In the present disclosure, unless otherwise explicitly specified and defined, a first feature being "over" or "below" a second feature may mean that the first feature and the second feature are in direct contact, or the first feature and the second feature are not in direct contact but are in contact through another feature therebetween. Moreover, the first feature being "over", "above", and "on" the second feature includes that the first feature is directly above or obliquely above the second feature, or merely means that the first feature has a larger horizontal height than the second feature. That the first feature is "below", "under", and "underneath" the second feature includes that the first feature is right below the second feature and is not right below the second feature, or merely represents that a horizontal height of the first feature is lower than that of the second feature.

Many different implementations or examples are provided below to implement different structures of the present disclosure. To simplify the disclosure of the present disclosure, the following describes components and settings of particular examples. Certainly, the components and settings are merely examples, and are not intended to limit the present disclosure. In addition, in the present disclosure, reference numbers and/or reference letters may be repeated in different examples. Such repetition is intended to simplify and clarify the present disclosure, and does not indicate a relationship between various implementations and/or settings that are discussed. In addition, the present disclosure provides examples of various specific processes and materials, but a person skilled in the art may be aware of the present disclosure of other processes and/or the use of other materials.

FIG. 1 is an exemplary schematic structural sectional view of a display device. In a display device 1' in FIG. 1, a back panel 3' is used as a design surface. A plastic frame 5' located on the left side, right side, and upper side of the display device 1' is adhered to an inner side of the back panel 3' using a double-sided adhesive tape, to form an accommodating cavity configured to place an optical assembly 6'. Then a display panel 2' is fixed on the plastic frame 5' using a double-sided adhesive tape, to avoid using a front frame, thereby implementing a bezel-less design on the left side, right side, and upper side of the display device F. In addition, a decorative strip 7' is disposed on the lower side of the display device 1' to cover and protect a drive cable (for example, a flexible circuit board) 4' bonded to the display panel 2'. As shown in FIG. 1, the decorative strip 7' has an inverted-"L" shape, and a horizontal part of the decorative strip 7' is located on a display surface of the display panel 2' to cover the drive cable 4'. The horizontal part of the decorative strip 7' leads to a relatively large bezel width on the lower side of the display device 1', and a four-side bezel-less design fails to be implemented.

It may be understood that a bezel-less design of a display device does not mean that there is no bezel at all, but instead mean that a bezel has a small width and is visually ignorable.

To implement a four-side bezel-less design for a display device, embodiments of the present disclosure provide a display device in which a conventional decorative strip is omitted, thereby greatly reducing costs, and implementing a real four-side bezel-less design.

As shown in FIGS. 2 to 8, embodiments of the present disclosure provide a display device 1. The display device 1 include a display panel 2, a back panel 3, a flexible circuit board 4, a plastic frame 5, a shading adhesive tape 6, and an optical assembly 7, wherein the shading adhesive tape 6 comprises a first section S1, a second section S2 and a third section S3.

Figure 3:
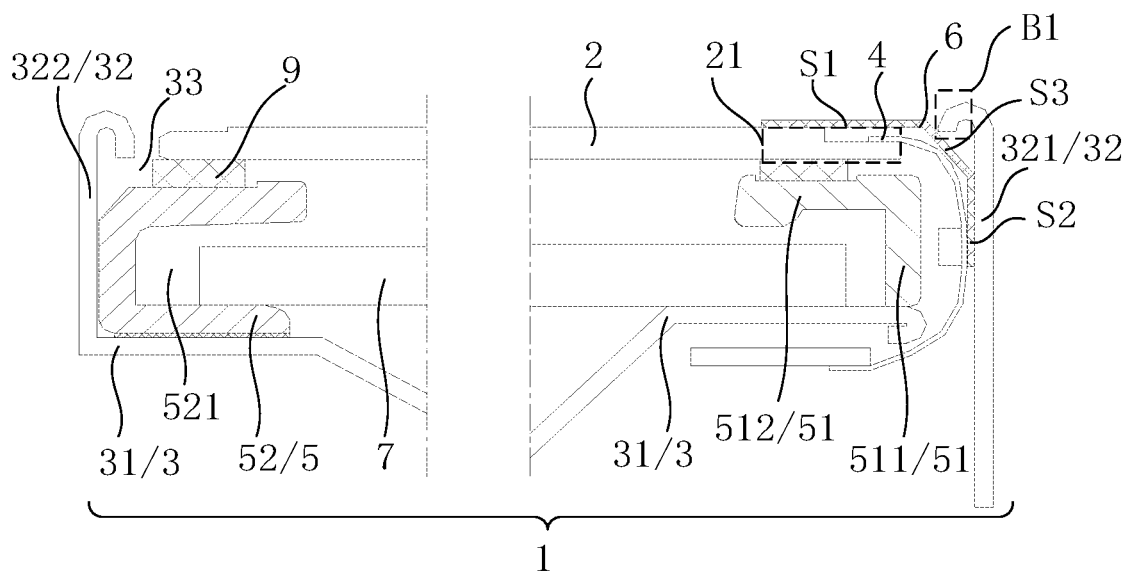
FIG. 3 is a schematic structural sectional view corresponding to a position A-A' in FIG. 2 of a display device according to an embodiment of the present disclosure.

As shown in FIG. 3, the display panel 2 may be a liquid crystal display panel. A bonding region 21 for bonding to the flexible circuit board 4 is provided on at least one side of the display panel 2, to receive a drive signal. To facilitate description, the present embodiment is described by using an example in which the bonding region 21 is provided on only one side of the display panel 2, but is not limited thereto.

Specifically, the display panel 2 includes an array substrate, an opposing substrate disposed opposite the array substrate, and a liquid crystal layer disposed between the array substrate and the opposing substrate. A color filter in the display panel 2 may be disposed in the opposing substrate or may be disposed in the array substrate. This is not limited herein. It requires to be noted that, a region (that is, a non-display region, not shown in the figure) with a particular width range at a perimeter of the display panel 2 does not display a picture. The non-display region is usually a black matrix (BM) region. That is, the non-display region is provided with a shading layer. The bonding region 21 in the embodiments of the present disclosure is located in a non-display region on a side of the display panel 2. Specifically, the BM may be disposed in the array substrate, or may be disposed in the opposing substrate. This is not limited herein.

In a specific implementation, the opposing substrate and the array substrate form a step in the bonding region 21. An end of the flexible circuit board 4 is bonded to the array substrate of the display panel 2 at the step.

Figure 4:
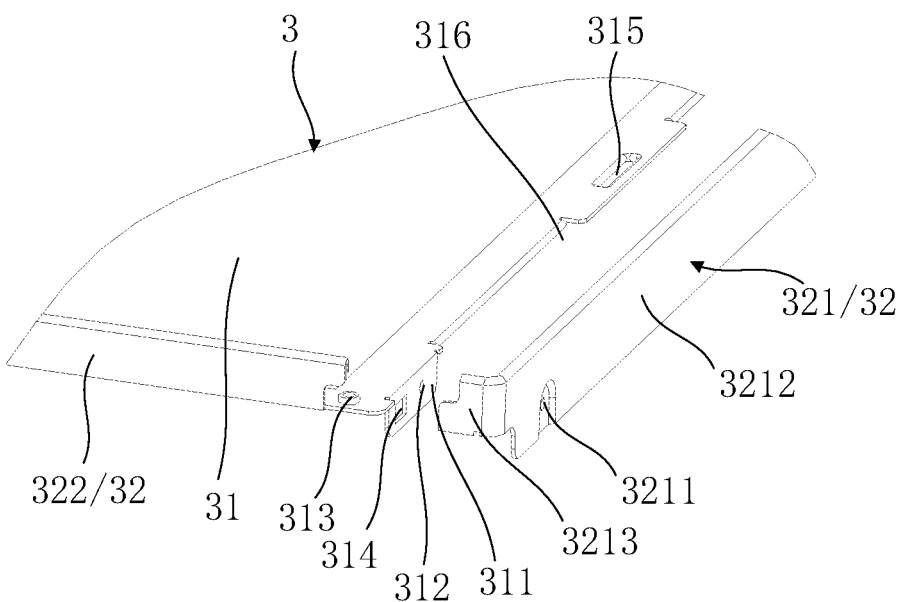
FIG. 4 is a partial schematic structural diagram of a back panel of a display device according to an embodiment of the present disclosure.

Referring to FIGS. 3 and 4, the back panel 3 includes a bottom board 31 and a lateral board 32 disposed surrounding the bottom board 31. The lateral board 32 and the bottom board 31 form a cavity 33 provided with a display window. The display panel 2 is located in the cavity 33, and a part of the lateral board 32 away from the bottom board 31 is disposed adjacent to a perimeter of the display panel 2. Specifically, the display panel 2 is disposed close to the display window, and a display surface of the display panel 2 is disposed toward the display window. The display surface of the display panel 2 may be disposed flush with a side of the lateral board 32 away from the bottom board 31, or may be slightly lower than the side of the lateral board 32 away from the bottom board 31.

It requires to be noted that, the lateral board 32 in the back panel 3 in the embodiments of the present disclosure is used as a lateral casing (that is, a design surface) of the display device 1. It may be understood that, no housing is additionally disposed on the outer side of the lateral board 32. In addition, in a specific implementation, the bottom board 31 of the back panel 3 may be used as a bottom casing of the display device 1. Certainly, in another specific implementation, an additional bottom casing may be disposed on the outer side of the bottom board 31.

As shown in FIGS. 3 and 4, the back panel 3 in the embodiments of the present disclosure has a split-type structure. In a specific implementation, the lateral board 32 includes a detachable board 321 disposed corresponding to a side provided with the bonding region 21 of the display panel 2 and three fixed lateral boards 322 disposed corresponding to the other three sides of the display panel 2. The detachable board 321 and the three fixed lateral boards 322 are all disposed in parallel to the display panel 2 in a thickness direction of the display panel 2. Specifically, the detachable board 321 is detachably connected to the bottom board 31, and the three fixed lateral boards 322 and the bottom board 31 are integrally formed. It may be understood that, the back panel 3 with a split-type structure is formed by two parts. One part is formed by the bottom board 31 and the three fixed lateral boards 322. The other part is the detachable board 321. After the two parts are combined, the cavity 33 provided with a complete closed side is formed, wherein the detachable board 321 is bent toward the display panel 2 to provide a bending end B1.

Figure 5:
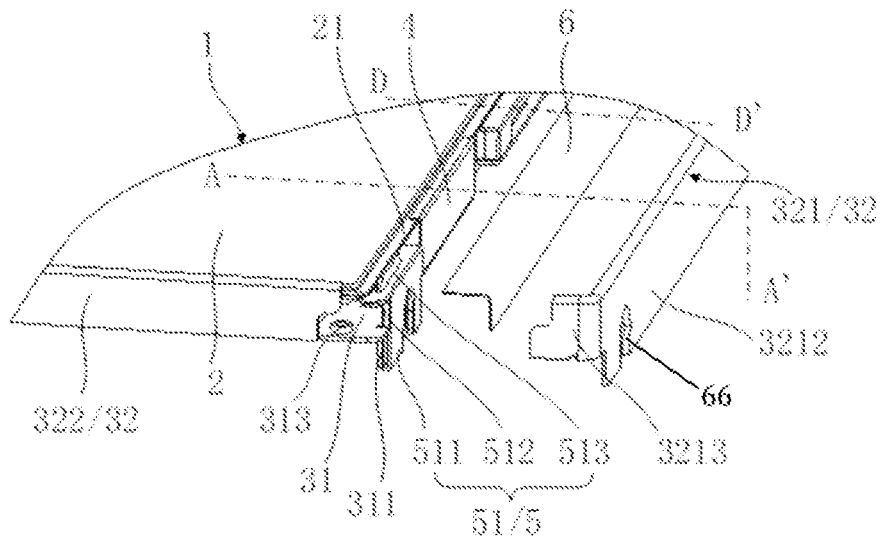
FIG. 5 is a partial schematic structural diagram of another display device according to an embodiment of the present disclosure.
Figure 6:
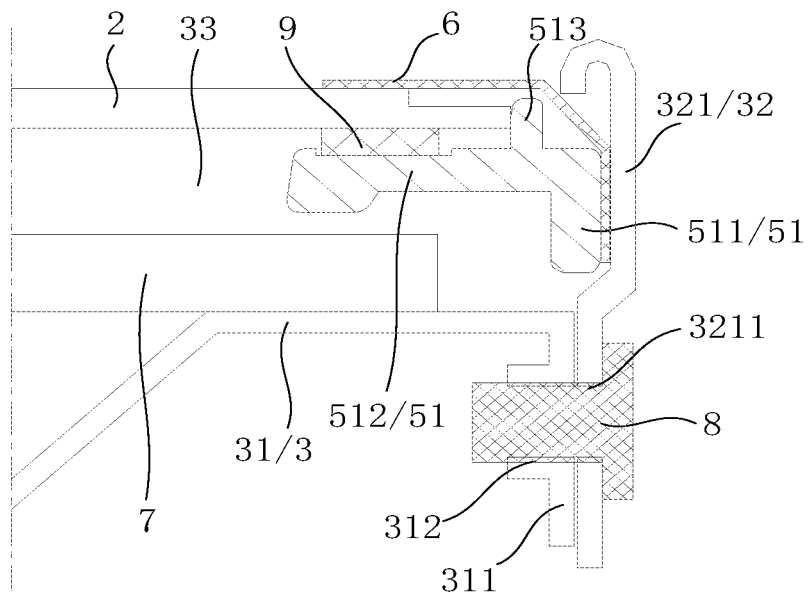
FIG. 6 is a schematic structural sectional view corresponding to a position B-B' in FIG. 2 of a display device according to an embodiment of the present disclosure.

Specifically, as shown in FIG. 6, the detachable board 321 may be fixedly connected to the bottom board 31 by a fixed connecting member 8. For example, in a specific implementation, as shown in FIGS. 4 to 6, at least one connecting portion 311 that is disposed in parallel to the detachable board 321 and extends in a direction away from the display panel 2 is provided on a side of the bottom board 31 close to the detachable board 321. A first hole portion 312 is provided in the connecting portion 311, and a second hole portion 3211 provided in alignment with the first hole portion 312 is provided in the detachable board 321. The fixed connecting member 8 penetrates the first hole portion 312 and the second hole portion 3211, to fixedly connect the detachable board 321 to the connecting portion 311. Specifically, there may be a plurality of first hole portions 312 and a plurality of second hole portions 3211. Specific quantities are not limited.

It requires to be noted that, a sunken groove 66 is further provided at a position corresponding to the connecting portion 311 in the detachable board 321. The second hole portion 3211 is disposed in the sunken groove 66. With the arrangement of the sunken groove, the fixed connecting member 8 can be prevented from protruding from a surface of the detachable board 321, which is beneficial to the appearance.

Certainly, as shown in FIGS. 4 and 5, at least one third hole portion 313 opening toward the display panel 2 may be further provided in the bottom board 31, and the detachable board 321 is correspondingly provided with a fixed portion (not shown in the figure) extending horizontally into the cavity 33. A fourth hole portion (not shown in the figure) provided in alignment with the third hole portion 313 is provided in the fixed portion. The fixed connecting member 8 may penetrate the third hole portion 313 and the fourth hole portion, to fixedly connect the detachable board 321 to the bottom board 31. Specifically, there may be a plurality of third hole portions 313 and a plurality of fourth hole portions. Specific quantities are not limited.

In a specific implementation, the fixed connecting member 8 may be a screw. Correspondingly, internal threads matching the screw are provided on inner sides of the first hole portion 312 and the second hole portion 3211, and internal threads matching the screw are provided on inner sides of the third hole portion 313 and the fourth hole portion.

In a specific implementation, the detachable board 321 includes a long-strip body portion 3212 and protruding portions 3213 extending from two ends of the body portion 3212 in directions toward two fixed lateral boards 322 adjacent to the detachable board 321. Correspondingly, the two fixed lateral boards 322 adjacent to the detachable board 321 are shortened in a direction away from the detachable board 321. A shortened length is same as the length of the protruding portions 3213. In addition, the shapes of sides of the two fixed lateral boards 322 adjacent to the detachable board 321 close to the protruding portions 3213 match the shapes of sides close to the fixed lateral boards 322 of the protruding portions 3213. Certainly, in another specific implementation, the detachable board 321 may have a simple long strip form. In this case, the lengths of the two fixed lateral boards 322 adjacent to the detachable board 321 are equal to the length of the corresponding bottom board 31.

In a specific implementation, as shown in FIG. 3, the side of the lateral board 32 away from the bottom board 31 (including the detachable board 321 and the fixed lateral boards 322) may be disposed bending in a direction toward the display panel 2. The design facilitates better control of a gap between the display panel 2 and the lateral board 32 in a process of completing the assembly of the display device 1, making the appearance more attractive.

As shown in FIG. 3, the plastic frame 5 is disposed in the cavity 33 and is disposed corresponding to the lateral board 32. The plastic frame 5 is fixedly connected to the bottom board 31. A back portion of the display panel 2 is fixedly connected to a side of the plastic frame 5 away from the bottom board 31 by a double-sided adhesive tape 9.

Specifically, the plastic frame 5 includes a detachable sub-plastic frame 51 disposed corresponding to the detachable board 321 and three fixing sub-plastic frames 52 disposed corresponding to the three fixed lateral boards 322. The detachable sub-plastic frame 51 and the bottom board 31 are detachably connected, for example, are fixedly connected by a snap structure.

Specifically, as shown in FIG. 5, the detachable sub-plastic frame 51 includes a support portion 511 detachably connected to the bottom board 31 and a first extending portion 512 extending horizontally from an end of the support portion 511 close to the display panel 2 in a direction away from the detachable board 321. The first extending portion 512 is fixedly connected to the back portion of the display panel 2. In addition, the first extending portion 512 is provided with at least one limiting structure 513. Each limiting structure 513 is laminated to a side of the display panel 2 close to the detachable board 321, and is configured to fix the position of the display panel 2.

Figure 7:
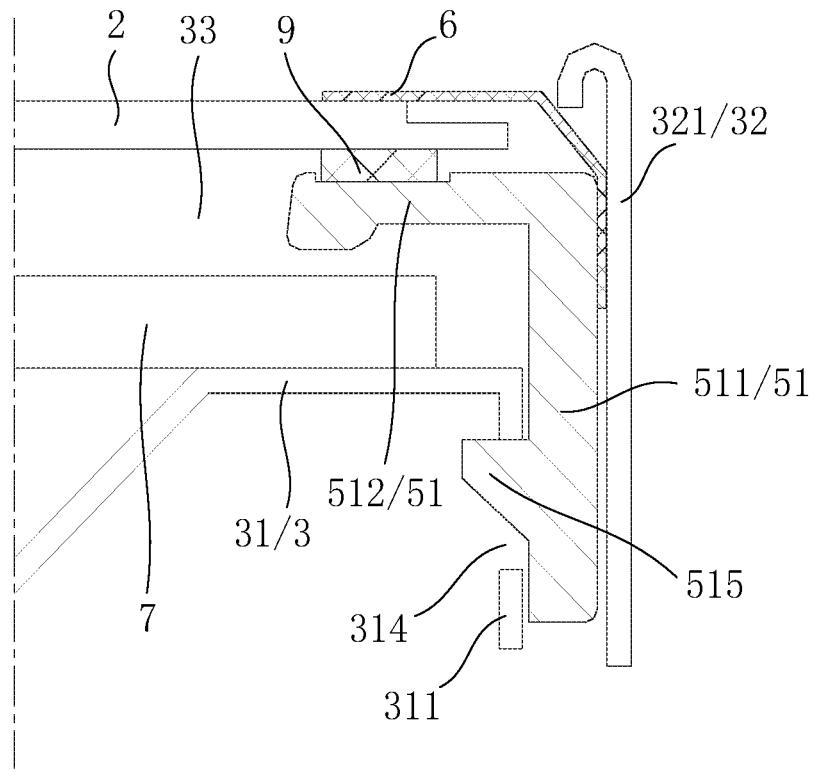
FIG. 7 is a schematic structural sectional view corresponding to a position C-C' in FIG. 2 of a display device according to an embodiment of the present disclosure.

In a specific implementation, referring to FIGS. 4 and 7, at least one first clamping groove 314 is further provided on the connecting portion 311 disposed on the bottom board 31, and a first clamping hook 515 provided in alignment with each first clamping groove 314 is provided on the support portion 511 of the detachable sub-plastic frame 51. The support portion 511 is fixedly connected to the bottom board 31 by the first clamping groove 314 and the first clamping hook 515. It may be understood that, the support portion 511 of the detachable sub-plastic frame 51 is sandwiched between the connecting portion 311 and the detachable board 321.

Certainly, as shown in FIG. 4, at least one second clamping groove 315 facing the display panel 2 may be disposed on the bottom board 31. In this case, a second extending portion (not shown in the figure) extending horizontally into the cavity 33 may be disposed on the support portion 511 of the detachable sub-plastic frame 51, and a second clamping hook (not shown in the figure) disposed in alignment with the second clamping groove 315 is disposed on the second extending portion. The support portion 511 is further fixedly connected to the bottom board 31 by the second clamping groove 315 and the second clamping hook.

Figure 8:
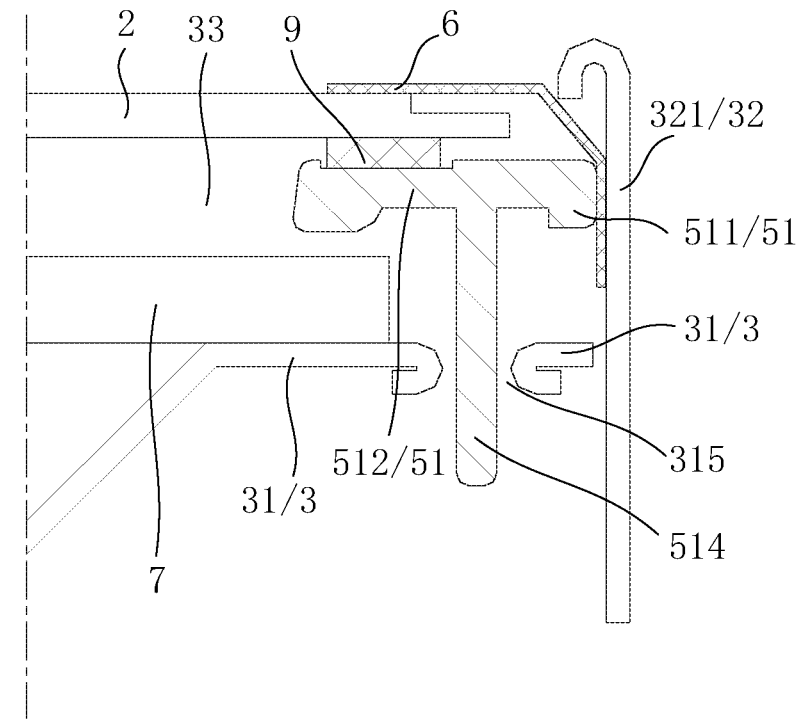
FIG. 8 is a schematic structural sectional view corresponding to a position D-D' in FIG. 5 of a display device according to an embodiment of the present disclosure.

Alternatively, referring to FIGS. 4 and 8, a third extending portion 514 perpendicular to the first extending portion 512 is disposed corresponding to the second clamping groove 315 on a side of the first extending portion 512 of the detachable sub-plastic frame 51 away from the display panel 2, and the third extending portion 514 matches the second clamping groove 315 and is configured to further fix the detachable sub-plastic frame 51.

Specifically, the three fixing sub-plastic frames 52 have split-type structures. That is, the three fixing sub-plastic frames 52 are not integrally formed, but are joined adjacently. As shown in FIG. 3, bottom portions of the three fixing sub-plastic frames 52 are fixedly connected to the bottom board 31 of the back panel 3 by a double-sided adhesive tape 9. An orthogonal projection of each fixing sub-plastic frames 52 in a direction perpendicular to the display panel 2 has a long strip form, and a vertical cross section of every fixing sub-plastic frame 52 has the same shape, for example, a semi-"I" shape. In addition, the three fixing sub-plastic frames 52 form an accommodating space 521, configured to place the optical assembly 7. The optical assembly 7 includes an optical diaphragm, a light-guide plate, a diffusion plate or a combination thereof, but is not limited thereto.

It requires to be noted that, a part fixedly connected to the plastic frame 5 of the bottom board 31 is disposed in parallel to the bottom portion of the plastic frame 5, that is, is disposed in parallel to the bottom portion of the display panel 2. When a backlight source of the display device 1 is of a direct-lit type, a middle part of the bottom board 31 may protrude in the direction away from the display panel 2 and form a space configured to place the backlight source. Certainly, when the backlight source of the display device 1 is of a side type, the entire bottom board 31 may be disposed in parallel to the bottom portion of the display panel 2.

In the present embodiment, the flexible circuit board 4 is configured to provide a drive signal to the display panel 2. As shown in FIG. 3, one end of the flexible circuit board 4 is located in the bonding region 21, and is bonded to a side (that is, a display surface) of the display panel 2 away from the bottom board 31. The other end (an end away from the display panel 2) of the flexible circuit board 4 extends through the cavity 33 to a side of the bottom board 31 away from the display panel 2. It may be understood that, the flexible circuit board 4 located in the cavity 33 is located between the detachable sub-plastic frame 51 and the detachable board 321.

Specifically, the flexible circuit board 4 includes a COF, and is certainly not limited thereto.

As shown in FIG. 3, the shading adhesive tape 6 is adjacent to a side of the lateral board 32 close to the cavity 33, and is specifically adjacent to a side of the detachable board 321 close to the cavity 33. At least a part of the shading adhesive tape 6 is bonded to a side of the display panel 2 away from the bottom board 31 and is disposed corresponding to the bonding region 21, and the shading adhesive tape 6 at least covers the flexible circuit board 4 located in the bonding region 21. It may be understood that, the shading adhesive tape 6 in the embodiments of the present disclosure is configured to cover and protect the flexible circuit board 4 located in the bonding region 21 of the display panel 2. Specifically, the material of the shading adhesive tape 6 may be polyethylene terephthalate (PET). The material may adequately protect the flexible circuit board 4. Certainly, the material of the shading adhesive tape 6 is not limited thereto. In addition, the color of the shading adhesive tape 6 and the color of the BM are consistent, and are both black, so that there is no visual difference between the shading adhesive tape 6 and the BM in the non-display region, making the shading adhesive tape 6 not easily perceivable by a user.

In a specific implementation, the shading adhesive tape 6 may be completely disposed on the side of the display panel 2 away from the bottom board 31 and disposed corresponding to the bonding region 21. Certainly, in another specific implementation, the shading adhesive tape 6 may be only partially disposed on a side of the display panel 2 away from the bottom board 31 and disposed corresponding to the bonding region 21, and a side of the shading adhesive tape 6 away from the display panel 2 extends into the cavity 33, and is bonded to a side of the detachable sub-plastic frame 51 close to the detachable board 321. In this case, the flexible circuit board 4 located in the cavity 33 is located between the plastic frame 5 and the shading adhesive tape 6. It may be understood that the shading adhesive tape 6 located in the cavity 33 covers the flexible circuit board 4 located in the cavity 33, and is laminated to the detachable board 321.

In a specific implementation, as shown in FIG. 4, a concave groove 316 that is concave in the direction away from the detachable board 321 is provided in the side of the bottom board 31 close to the detachable board 321 of the back panel 3, so that the side of the bottom board 31 close to the detachable board 321 is uneven. Specifically, as shown in FIG. 5, a body shape of the support portion 511 of the detachable sub-plastic frame 51 matches the side of the bottom board 31 close to the detachable board 321. It may be understood that, at a position provided with the concave groove 316 on the bottom board 31, the support portion 511 is also concave in the direction away from the detachable board 321. In addition, a part located in the cavity 33 of the flexible circuit board 4 is disposed corresponding to the concave groove 316, so that the flexible circuit board 4 is laminated to the part concave in a direction away from the detachable board 321 of the support portion 511 to extend to the back portion of the bottom board 31. It may be understood that, a part located in the cavity 33 of the shading adhesive tape 6 is bonded to a convex part (relative to the concave part, that is, the part protruding toward the detachable board 321) of the support portion 511 of the detachable sub-plastic frame 51. The part of the shading adhesive tape 6 may not directly contact the flexible circuit board 4 in the cavity 33, but instead is sandwiched between the support portion 511 of the detachable sub-plastic frame 51 and the detachable board 321. Certainly, a specific structure of the side of the bottom board 31 close to the detachable board 321 of the back panel 3 is not limited thereto, and may be adjusted according to a specific case.

In the display device 1 provided in the embodiments of the present disclosure, a cover adhesive tape and the detachable board 321 are used to replace a conventional decorative strip. In an aspect, the cover adhesive tape is black and covers the bonding region 21 of the display panel 2, and may cover and protect the flexible circuit board 4 located in the bonding region 21. In addition, the bonding region 21 of the display panel 2 usually has a relatively small width, and a black shading layer (for example, the BM) is provided in a peripheral non-display region of the display panel 2. The width of the cover adhesive tape is same as that of the bonding region 21, and the color of the cover adhesive tape is same as that of the shading layer. Therefore, the arrangement of the cover adhesive tape 6 is not easily visually perceivable. In another aspect, the costs of the cover adhesive tape are much less than those of a decorative strip, to facilitate reduction of costs. In still another aspect, when the lateral board 32 of the back panel 3 is used as a housing, the side of the display panel 2 and the flexible circuit board 4 located in the cavity 33 can be covered and protected, and the thickness of the lateral board is relatively small, to better narrow the bezel. In addition, the thickness of the lateral board 32 is relatively small and controllable, to facilitate considerable narrowing of bezels, so that an as close as possible bezel-less design is implemented for the bezels of the display device 1. Therefore, in the embodiments of the present disclosure, a decorative strip that is disposed on a display surface of a display panel 2, configured to cover the bonding region 21, and has relatively high costs can be omitted, so that production costs can be greatly reduced, and a real four-side bezel-less design can be implemented for the display device 1.

The display device provided in the embodiments of the present disclosure is described above in detail. Specific examples are applied herein to describe the principle and implementation of the present disclosure. The description of the foregoing embodiments is only to help understand the technical solutions of the present disclosure and the core idea thereof. It should be understood by persons of ordinary skill in the art that modifications can be made to the technical solutions described in the foregoing embodiments, or equivalent replacements can be made to some technical features in the technical solutions, as long as such modifications or replacements do not cause the essence of corresponding technical solutions to depart from scope of the technical solutions of the embodiments of the present disclosure.

What is claimed is:

1. A display device, comprising:
    a display panel, a bonding region being provided on at least one side of the display panel;
    a back panel, comprising a bottom board and a lateral board disposed surrounding the bottom board, wherein the lateral board and the bottom board form a cavity, the display panel is located in the cavity, and a part of the lateral board away from the bottom board is disposed adjacent to a perimeter of the display panel; and
    a shading adhesive tape, wherein the shading adhesive tape comprises a first section, a second section, and a third section, wherein the second section is adjacent to a side of the lateral board close to the cavity, the first section is adhered to a side of the display panel away from the bottom board and is disposed corresponding to the bonding region, the third section is inclined downward, and the first section and the second sections are connected by the third section;
    wherein the lateral board comprises a detachable board; the detachable board is bent toward the display panel to provide a bending end, the bending end of the detachable board is disposed beyond a lateral side of the display panel,
    wherein an orthographic projection of the bending end on a plane parallel to the display panel is within an orthographic projection of the third section on the plane parallel to the display panel.

2. The display device as claimed in claim 1, wherein a side of the detachable board close to the cavity is adjacent to the shading adhesive tape; and the detachable board is detachably connected to the bottom board.

3. The display device as claimed in claim 2, wherein the display device further comprises a flexible circuit board; a part of the flexible circuit board is located in the bonding region, and is bonded to the side of the display panel away from the bottom board; and
    the shading adhesive tape at least covers the flexible circuit board located in the bonding region.

4. The display device as claimed in claim 3, wherein an end of the flexible circuit board away from the display panel extends through the cavity to a side of the bottom board away from the display panel;
    an end of the shading adhesive tape away from the display panel further extends into the cavity; and the shading adhesive tape located in the cavity covers the flexible circuit board located in the cavity, and is laminated to the detachable board.

5. The display device as claimed in claim 4, wherein the display device further comprises a plastic frame that is disposed in the cavity and is disposed corresponding to the lateral board, and the plastic frame is fixedly connected to the bottom board; a back portion of the display panel is fixedly connected to a side of the plastic frame away from the bottom board; and
    the shading adhesive tape located in the cavity is adhered to a side of the plastic frame close to the detachable board; and the flexible circuit board located in the cavity is located between the plastic frame and the shading adhesive tape.

6. The display device as claimed in claim 5, wherein the plastic frame comprises a detachable sub-plastic frame disposed corresponding to the detachable board; the detachable sub-plastic frame is detachably connected to the bottom board;
    the shading adhesive tape located in the cavity is adhered to a side of the detachable sub-plastic frame close to the detachable board; and the flexible circuit board located in the cavity is located between the detachable sub-plastic frame and the shading adhesive tape.

7. The display device as claimed in claim 6, wherein the detachable sub-plastic frame comprises a support portion detachably connected to the bottom board and an extending portion extending horizontally from an end of the support portion close to the display panel in a direction away from the detachable board; the extending portion is fixedly connected to the back portion of the display panel; and
    at least one limiting structure is provided on the extending portion, and the at least one limiting structure is laminated to a side of the display panel close to the detachable board.

8. The display device as claimed in claim 6, wherein the detachable sub-plastic frame is fixedly connected to the bottom board.

9. The display device as claimed in claim 2, wherein at least one connecting portion that is disposed in parallel to the detachable board and extends in a direction away from the display panel is provided on a side of the bottom board close to the detachable board; a first hole portion is provided in the connecting portion;
    a second hole portion provided in alignment with the first hole, portion is provided in the detachable board; and
    the display device further comprises a fixed connecting member, and the fixed connecting member penetrates the first hole portion and the second hole portion to fixedly connect the detachable board to the connecting portion.

10. The display device as claimed in claim 1, wherein a side of the lateral board away from the bottom board is disposed bending in a direction toward the display panel.

11. The display device as claimed in claim 9, wherein a sunken groove is provided at a position corresponding to the connecting portion in the detachable board, the second hole portion is provided in the sunken groove.

12. The display device as claimed in claim 11, wherein the display device further comprises a flexible circuit board; a part of the flexible circuit board is located in the bonding region, and is bonded to the side of the display panel away from the bottom board; and
    the shading adhesive tape at least covers the flexible circuit board located in the bonding region.

13. The display device as claimed in claim 12, wherein an end of the flexible circuit board away from the display panel extends through the cavity to a side of the bottom board away from the display panel;
    an end of the shading adhesive tape away from the display panel further extends into the cavity; and the shading adhesive tape located in the cavity covers the flexible circuit board located in the cavity, and is laminated to the detachable board.

14. The display device as claimed in claim 13, wherein the display device further comprises a plastic frame that is disposed in the cavity and is disposed corresponding to the lateral board, and the plastic frame is fixedly connected to the bottom board; a back portion of the display panel is fixedly connected to a side of the plastic frame away from the bottom board; and
    the shading adhesive tape located in the cavity is adhered to a side of the plastic frame close to the detachable board; and the flexible circuit board located in the cavity is located between the plastic frame and the shading adhesive tape.

15. The display device as claimed in claim 14, wherein the plastic frame comprises a detachable sub-plastic frame disposed corresponding to the detachable board; the detachable sub-plastic frame is detachably connected to the bottom board;

the shading adhesive tape located in the cavity is adhered to a side of the detachable sub-plastic frame close to the detachable board; and the flexible circuit board located in the cavity is located between the detachable sub-plastic frame and the shading adhesive tape.

16. The display device as claimed in claim 15, wherein the detachable sub-plastic frame comprises a support portion detachably connected to the bottom board and an extending portion extending horizontally from an end of the support portion close to the display panel in a direction away from the detachable board; the extending portion is fixedly connected to the back portion of the display panel; and at least one limiting structure is provided on the extending portion, and the at least one limiting structure is laminated to a side of the display panel close to the detachable board.

17. The display device as claimed in claim 15, wherein the detachable sub-plastic frame is fixedly connected to the bottom board.

18. The display device as claimed in claim 2, wherein the lateral board further comprises two fixing lateral boards adjacent to the detachable board, the detachable board comprises a body portion in a long strip form and protruding portions extending from two ends of the body portion in directions toward the two fixing lateral boards.

19. The display device as claimed in claim 18, wherein the display device further comprises a flexible circuit board: a part of the flexible circuit board is located in the bonding region, and is bonded to the side of the display panel away from the bottom board; and the shading adhesive tape at least covers the flexible circuit board located in the bonding region.

20. The display device as claimed in claim 19, wherein an end of the flexible circuit board away from the display panel extends through the cavity to a side of the bottom board away from the display panel;

an end of the shading adhesive tape away from the display panel further extends into the cavity; and the shading adhesive tape located in the cavity covers the flexible circuit board located in the cavity, and is laminated to the detachable board.

\* \* \* \* \*